(12) United States Patent
Kim et al.

(10) Patent No.: US 12,365,700 B2
(45) Date of Patent: Jul. 22, 2025

(54) GROUP 4 METAL ELEMENT-CONTAINING COMPOUND, PRECURSOR COMPOSITION INCLUDING SAME, AND METHOD FOR MANUFACTURING THIN FILM USING SAME

(71) Applicant: HANSOL CHEMICAL CO., LTD., Seoul (KR)

(72) Inventors: Hyun-Kee Kim, Jeollabuk-do (KR); Cheol-Wan Park, Jeollabuk-do (KR); Ki-Yeung Mun, Jeollabuk-do (KR); Ee-Seul Shin, Ulsan (KR); Eun-Jeong Cho, Jeollabuk-do (KR); Jang-Hyeon Seok, Sejong-si (KR); Jung-Woo Park, Seoul (KR)

(73) Assignee: HANSOL CHEMICAL CO., LTD., Seoul (KR)

( * ) Notice: Subject to any disclaimer, the term of this patent is extended or adjusted under 35 U.S.C. 154(b) by 108 days.

(21) Appl. No.: 18/025,017

(22) PCT Filed: Sep. 6, 2021

(86) PCT No.: PCT/KR2021/012037
§ 371 (c)(1),
(2) Date: Mar. 7, 2023

(87) PCT Pub. No.: WO2022/055201
PCT Pub. Date: Mar. 17, 2022

(65) Prior Publication Data
US 2023/0312614 A1     Oct. 5, 2023

(30) Foreign Application Priority Data
Sep. 8, 2020 (KR) .................. 10-2020-0114508

(51) Int. Cl.
*C07F 7/28* (2006.01)
*C07F 7/00* (2006.01)
*C23C 16/40* (2006.01)
*C23C 16/44* (2006.01)
*C23C 16/455* (2006.01)

(52) U.S. Cl.
CPC .................. *C07F 7/00* (2013.01); *C07F 7/28* (2013.01); *C23C 16/40* (2013.01); *C23C 16/405* (2013.01); *C23C 16/44* (2013.01); *C23C 16/45553* (2013.01)

(58) Field of Classification Search
CPC ............... C07F 7/28; C07F 7/003; C07F 7/00
USPC .......................................................... 548/101
See application file for complete search history.

(56) References Cited

U.S. PATENT DOCUMENTS

| | | | |
|---|---|---|---|
| 5,607,722 A | 3/1997 | Vaartstra et al. | |
| 5,908,947 A | 6/1999 | Vaartstra | |
| 2009/0321733 A1* | 12/2009 | Gatineau | C01G 25/02 438/758 |
| 2010/0112211 A1 | 5/2010 | Xu et al. | |

FOREIGN PATENT DOCUMENTS

| | | | | |
|---|---|---|---|---|
| CN | 101469006 A | | 7/2009 | |
| CN | 110016331 A | * | 7/2019 | ............ C08F 292/00 |
| JP | 2013-527147 A | | 12/2011 | |
| KR | 10-2010-0016477 A | | 2/2010 | |
| KR | 10-2012-0045031 A | | 5/2012 | |
| KR | 10-2012-0105070 A | | 9/2012 | |
| KR | 10-2014-0029428 A | | 3/2014 | |
| KR | 10-2014-0078534 A | | 6/2014 | |
| KR | 10-2018-0056949 A | | 5/2018 | |
| KR | 10-2018-0097449 A | | 8/2018 | |
| TW | 201241224 A | | 10/2012 | |
| WO | 2008/128141 A1 | | 10/2008 | |
| WO | 2011/139034 A1 | | 11/2011 | |
| WO | 2012/138332 A1 | | 10/2012 | |

OTHER PUBLICATIONS

International Search Report and Written Opinion from related PCT Application No. PCT/KR2021/012037, dated Sep. 6, 2021, 9 pages.

\* cited by examiner

*Primary Examiner* — Charanjit Aulakh
(74) *Attorney, Agent, or Firm* — Brooks, Cameron & Huebsch, PLLC (57) ABSTRACT

The present disclosure relates to a novel Group 4 metal element-containing compound having excellent thermal stability, a precursor composition including the compound, and a method for manufacturing a thin film using the precursor composition. The novel Group 4 metal element-containing compound according to the present disclosure and the vapor deposition precursor composition including the compound can have excellent thermal stability, realize thin film deposition in a wide temperature range, and reduce residues caused by heat loss, thereby preventing side reactions in a process. Additionally, the vapor deposition precursor composition according to the present disclosure can realize uniform thin film deposition, thereby securing excellent physical properties of the thin film.

2 Claims, 8 Drawing Sheets

GROUP 4 METAL ELEMENT-CONTAINING COMPOUND, PRECURSOR COMPOSITION INCLUDING SAME, AND METHOD FOR MANUFACTURING THIN FILM USING SAME

TECHNICAL FIELD

The present disclosure relates to a Group 4 metal element-containing compound having excellent thermal stability, a precursor composition including the compound, and a method for manufacturing a thin film using the precursor composition.

BACKGROUND ART

A gate oxide film (gate dielectric film) used in the gate structure of a metal-oxide-semiconductor field effect transistor (MOSFET), which is a core structure of semiconductor devices, suffers from disadvantages such as an increase in leakage current and formation of a gate depletion layer due to a thin oxide film resulting from device integration of silicon oxide, which is an original material. Capacitance is proportional to the relative dielectric constant of a capacitor insulating film and the area of an electrode, and is inversely proportional to the thickness thereof. Therefore, in order to increase the capacitance using a high-dielectric constant material without the reduction of the thickness of the thin film, capacitors have evolved to ones that have a stacked structure. Accordingly, what is technically required is to form a thin film with a uniform thickness, which serves as an electrode layer or a dielectric layer in a structure having a constant aspect ratio. To address these needs, starting from the 100 nm process, $Al_2O_3$ was adopted as a high-dielectric constant material, and, at the same time, atomic layer deposition (ALD) technology was introduced as a process for securing step coverage of thin films. A micro-process technology of 80 nm or less demands an oxide material with a high-dielectric constant, and accordingly, an oxide film including zirconium or ($ZrO_2$, $HfO_2$, or the like) is used in the industry.

Examples of material used as a primary precursor of a zirconium oxide film include TEMAZ (Tetrakis Ethyl Methyl Amino Zirconium), CpTDMAZ (Cyclopentadienyl tris-dimethylamino zirconium), and the like. In the case of TEMAZ, it forms a zirconium oxide film with a monoclinic system or triclinic system crystal structure, and has a limitation in not securing step coverage due to rapid precursor decomposition at 280° C. or higher. The CpTDMAZ precursor utilizes a cyclopentadienyl group to strongly bond with a metal ion through a π bond, and is a precursor capable of realizing an ALD process up to 300° C. by introducing a dimethyl amino group to suppress the β, γ hydrogen removal reaction by heat. Therefore, from the 30 nm process, the precursor has been changed to CpTDMAZ instead of TEMAZ. However, CpTDMAZ also has a disadvantage in that the precursor is decomposed rapidly at 310° C. or higher.

Meanwhile, Korean Unexamined Patent Application Publication Nos. 10-2012-0105070 and 10-2014-0078534 disclose descriptions regarding a compound containing Group 4 metal elements such as zirconium, and Group 4 metal element-containing thin films, but there is a limit to securing thermal stability and improving thin film deposition uniformity because of the structure of the compound.

RELATED DOCUMENTS

Patent Documents

Patent document 1: Korean Patent Application Publication No. 10-2012-0105070
Patent document 2: Korean Patent Application Publication No. 10-2014-0078534

SUMMARY OF INVENTION

Technical Problem

The present disclosure is to provide a novel Group 4 metal element-containing compound applicable to an atomic layer deposition (ALD) method or a chemical vapor deposition (CVD) method, and a vapor deposition precursor composition including the same.

In particular, the present disclosure is to provide a vapor deposition precursor composition that has excellent thermal stability, enables a thin film deposition in a wide temperature range, can reduce residues caused by heat loss, thereby preventing side reactions in a process, and can uniformly deposit a thin film with excellent physical properties.

However, the problems to be solved by the present disclosure are not limited to the above-mentioned problems, and problems other than mentioned above will be clearly appreciated by those skilled in the art from the following description.

Solution to Problem

One aspect of the present application provides a compound represented by Formula 1 below:

[Formula 1]

wherein M denotes any one selected from Group 4 metal elements, $R_1$ to $R_4$ denote each independently hydrogen, a substituted or unsubstituted, linear or branched, saturated or unsaturated hydrocarbon group having 1 to 6 carbon atoms, $R_5$ and $R_6$ denote each independently a linear or branched alkyl group having 1 to 4 carbon atoms, a dialkylamine group having 1 to 4 carbon atoms, or an alkoxy group having 1 to 4 carbon atoms.

Another aspect of the present application provides a vapor deposition precursor composition including the above-described compound.

Still another aspect of the present application provides a method for manufacturing a thin film, including forming a Group 4 metal element-containing thin film using the vapor deposition precursor composition.

Advantageous Effects

The novel Group 4 metal element-containing compound according to the present disclosure and the vapor deposition precursor composition including the compound can have excellent thermal stability, realize thin film deposition in a wide temperature range, and reduce residues caused by heat loss, thereby preventing side reactions in a process.

Additionally, the vapor deposition precursor composition according to the present disclosure can realize uniform thin film deposition, thereby securing excellent physical properties of the thin film.

The above-described physical properties can provide a precursor suitable for an atomic layer deposition method, and can be expected to be applied to a gate dielectric material through a thin film manufactured by depositing the precursor.

BEST MODE

Hereinafter, embodiments and examples of the present disclosure will be described in detail such that those of ordinary skill in the art to which the present disclosure pertains can easily practice them However, the disclosure can be embodied in various different forms, and the scope of the disclosure should not be construed as being limited to the embodiments and the examples described herein.

Throughout the specification of the present application, when a member is described as being located "on" another member, this includes not only a case in which the member is in contact with the other member but also a case in which another member exists between the two members.

Throughout the specification of the present application, when a part "includes" or "comprises" a component, it means not that the part excludes other component, but instead that the part may further include other component unless expressly stated to the contrary.

In addition, throughout the specification of the present application, the term "a step to" or "a step of does not mean step for".

Throughout the specification of the present application, the term "alkyl" includes linear or branched alkyl groups having 1 to 6 carbon atoms, preferably linear or branched alkyl groups having 1 to 4 carbon atoms, and all possible isomers thereof. Examples of the alkyl group may include, but are not limited to, a methyl group (Me), an ethyl group (Et), an n-propyl group ($^n$Pr), an iso-propyl group ($^i$Pr), an n-butyl group ($^n$Bu), a tert-butyl group ($^t$Bu), an iso-butyl group ($^i$Bu), a sec-butyl group ($^{sec}$Bu), an n-pentyl group, an iso-pentyl group, a neo-pentyl group, a sec-pentyl group, a tert-pentyl group, a hexyl group, an isohexyl group, isomers thereof, and the like.

Throughout the specification of the present application, the term "Group 4 metal element" refers to a chemical element belonging to Group 4 of the periodic table, and may include Zr, Hf, or Ti.

Throughout the specification of the present application, the term "Cp" is represented as —$C_5H_4$, and means an abbreviation for a "cyclopentadienyl group".

Hereinafter, embodiments and examples of the present disclosure will be described in detail with reference to the accompanying drawings. However, the present application is not limited to these embodiments, examples and drawings.

The present disclosure is applicable to an atomic layer deposition method or a chemical vapor deposition method, and relates to a novel Group 4 metal element-containing compound with excellent reactivity, volatility and thermal stability, a vapor deposition precursor composition including the Group 4 metal element-containing compound, a method for manufacturing a thin film using the precursor composition, and a Group 4 metal element-containing thin film manufactured from the precursor composition.

One aspect of the present application provides a compound represented by Formula 1 below

[Formula 1]

In Formula 1 above, M denotes any one selected from among Group 4 metal elements, preferably zirconium (Zr), hafnium (Hf) or titanium (Ti); $R_1$ to $R_4$ denote each independently hydrogen, a substituted or unsubstituted, linear or branched, saturated or unsaturated hydrocarbon group having 1 to 6 carbon atoms; and $R_5$ and $R_6$ denote each independently a linear or branched alkyl group having 1 to 4 carbon atoms, a dialkylamine group having 1 to 4 carbon atoms, or an alkoxy group having 1 to 4 carbon atoms.

Preferably, $R_1$ and $R_2$ denote each independently a linear or branched alkyl group having 1 to 4 carbon atoms; $R_3$ and $R_4$ denote each independently hydrogen or a linear or branched alkyl group having 1 to 4 carbon atoms; and $R_5$ and $R_6$ denote each independently a linear alkyl group having 1 to 4 carbon atoms or a linear dialkylamine group having 1 to 4 carbon atoms.

In an embodiment of the present application, it may be preferable that the compound represented by Formula 1 is represented as any one of Formulas 1-1 to 1-9 below.

[Formula 1-1]

[Formula 1-2]

[Formula 1-3]

[Formula 1-4]

[Formula 1-5]

[Formula 1-6]

[Formula 1-7]

[Formula 1-8]

[Formula 1-9]

wherein in Formulas 1-1 to 1-6 above, Me denotes a methyl group.

The compound according to the present disclosure is an amino chelate compound with a Group 4 metal element as a central metal, has excellent reactivity and volatility, and has the advantage of being able to be purified at a relatively low temperature.

In an embodiment of the present application, the compound represented by Formula 1 above may be in a liquid phase at room temperature. In atomic layer deposition (ALD), the reactants need to be highly volatile, and the materials need to be stable and highly reactive. The atomic layer deposition (ALD) method is a method in which reaction raw materials are supplied separately, and a thin film with less than a monolayer is grown by surface reaction during one cycle of the deposition wherein the ligand of the reaction raw material adsorbed on the substrate is removed through a chemical reaction with another reaction raw material supplied later. When heating a precursor compound which is a reaction raw material for atomic layer deposition, if it is in a liquid phase, then this can be much more advantageous in terms of a reaction rate and a process when compared to being in a solid phase.

Another aspect of the present application provides a vapor deposition precursor composition including the above-described compound.

All of the contents described with respect to the Group 4 metal element-containing compound according to the present disclosure may be applied to the vapor deposition precursor composition according to the present disclosure, and although detailed descriptions of overlapping pails have been omitted, the same can be applied thereto despite their omission.

In an embodiment of the present application, the vapor deposition may include atomic layer deposition (ALD) or chemical vapor deposition (CVD), and the chemical vapor deposition may include metal organic chemical vapor deposition (MOCVD).

Still another aspect of the present application provides a method for manufacturing a thin film, including forming a Group 4 metal element-containing thin film using the vapor deposition precursor composition, and a Group 4 metal element-containing thin film manufactured by the method.

All of the contents described with respect to the Group 4 metal element-containing compound according to the present disclosure and the precursor composition including the same may be applied to the method for manufacturing a thin film according to the present disclosure, and although detailed descriptions of overlapping parts have been omitted, the same can be applied thereto despite their omission.

In an embodiment of the present application, the forming of the Group 4 metal element-containing thin film may include introducing the vapor deposition precursor composition into a chamber and onto a substrate, and the introducing of the vapor deposition precursor into the chamber may include performing physical adsorption, chemical adsorption, or physical adsorption and chemical adsorption.

In an embodiment of the present application, the method for manufacturing a thin film may include both an atomic layer deposition (ALD) method in which the vapor deposition precursor composition of the present disclosure and the reaction gas are sequentially introduced, and a chemical vapor deposition (CVD) method in which a film is formed by continuously injecting the vapor deposition precursor of the present disclosure and the reaction gas.

More specifically, the deposition method may include, but is not limited to, metal organic chemical vapor deposition (MOCVD), low pressure chemical vapor deposition (LPCVD), pulsed chemical vapor deposition (P-CVD), plasma enhanced atomic layer deposition (PE-ALD), or a combination thereof.

The method for manufacturing a Group 4 metal element-containing thin film according to an embodiment of the present application may include, but is not limited to, providing one or more surfaces of a substrate to a reaction chamber; introducing a precursor composition including the Group 4 metal element-containing compound into the reaction chamber; and introducing a reaction gas into the reaction chamber, wherein a Group 4 metal element-containing thin film may be formed on the one or more surfaces of the substrate by vapor deposition.

Additionally, the Group 4 metal element-containing thin film may include a Group 4 metal element-containing oxide film, nitride film, oxynitride film, carbide film, or carbonitride film, and specifically, may be an oxide film of zirconium, hafnium, or titanium, a nitride film, an oxynitride film, a carbide film, or a carbonitride film.

In an embodiment of the present application, the reaction gas may include one selected from the group consisting of an oxygen-containing source, a nitrogen-containing source, a carbon source, a silicon source, a reducing agent, and combinations thereof.

More specifically, any one or more selected from among hydrogen ($H_2$), water ($H_2O$), oxygen ($O_2$), ozone ($O_3$), ammonia ($NH_3$), hydrazine ($N_2H_4$), and silane may be used as the reaction gas, but are not required.

Specifically, water ($H_2O$), oxygen ($O_2$) and ozone ($O_3$) may be used as reaction gases to deposit a Group 4 metal element-containing oxide thin film, and ammonia ($NH_3$) or hydrazine ($N_2H_4$) may be used as a reaction gas to deposit a Group 4 metal element-containing nitride thin film.

In addition, hydrogen ($H_2$) may be used as a reaction gas to deposit a Group 4 metal element-containing thin film, and silanes compounds may be used as a reaction gas to deposit a Group 4 metal element-containing silicide thin film.

Further, in order to help the movement of the precursor onto the substrate, to ensure that the inside of the reactor has an appropriate pressure for deposition, and to release impurities or the like present in the reactor to the outside, a process of purging an inert gas such as argon (Ar), nitrogen ($N_2$), or helium (He) in the reactor before and after supplying the reaction gas may be additionally performed.

DESCRIPTION OF EMBODIMENTS

Hereinafter, the present disclosure will be described in more detail through examples. However, the following examples are intended to illustrate the present disclosure in more detail, and the scope of the present disclosure is not limited by the following examples.

Synthesis Example 1

Synthesis of $N^1,N^2$-Di-Tert-Butylpropane-1,2-Diamine 2211.2 mL (21.04 mol) of tert-butylamine ($^tBuNH_2$) was dissolved in 4 L of methylene chloride (MC). To the solution, a solution obtained by dissolving 1,000 g (4.67 mol) of 2-bromoisobutyryl bromide (Bromopropanoyl bromide) in 1 L of MC was slowly added at a low temperature, and then agitation was performed at room temperature for 2 hours. After adding 374.08 g (9.35 mol) of sodium hydroxide (NaOH) to the solution, it was subjected to a reflux reaction for 20 hours using a reflux condenser. After completion of the reaction, water was added to the solution, which was extracted with MC, and then the solvent and remaining $^tBuNH_2$ were removed under reduced pressure to obtain 709 g (yield: 76.0%) of N-tert-butyl-2-(tert-butylamino)propanamide [N-(tert-butyl)-2-(tert-butylamino)prop, amide] as a white solid.

After 672.03 g (17.7 mol) of lithium aluminum hydride ($LiAlH_4$) was suspended in 4 L of tetrahydrofurane (THF) at low temperature, a solution obtained by dissolving the synthesized solid in 1 L of THF was slowly added at low temperature. After this, the suspension was subjected to a reflux reaction for 1 day using a reflux condenser. After completion of the reaction, water was added at low temperature to the suspension, which was extracted with MC, and the solvent was removed under reduced pressure to obtain a transparent orange liquid. The transparent orange liquid was purified under reduced pressure to obtain 590.0 g (yield: 89%) of $N^1,N^2$-di-tert-butylpropane-1,2-diamine of Formula 2 below, which is a colorless liquid.

[Formula 2]

Boiling point (b.p.): 42° C.@0.2 torr (bath reference)
$^1$H-NMR($C_6D_6$): δ1.046 (($\underline{CH_3}$)$_3$CNHCH($\underline{CH_3}$)$CH_2$NHC($\underline{CH_3}$)$_3$, m, 21H),
δ2.277 (($CH_3$)$_3$CNH$\underline{CH}$($CH_3$)$\underline{CH_2}$NHC($CH_3$)$_3$, in, 1H),
δ2.414 (($CH_3$)$_3$CNHC$\underline{H}$($CH_3$)$_2\overline{CH_2}$NHC($CH_3$)$_3$, m, 1H),
δ2.653 (($CH_3$)$_3$CNHC$\overline{H}$($CH_3$)$_2\underline{CH_2}$NHC($CH_3$)$_3$, m, 1H).

Synthesis Example 2

Synthesis of $N^1,N^2$-Di-Tert-Butyl-2-Methylpropane-1,2-Diamine 1,431 g (19.57 mol) of tert-butylamine ($^tBuNH_2$) was dissolved in 4 L of methylene chloride (MC). To the solution, a solution obtained by dissolving 1,000 g (4.34 mol) of 2-bromopropanoyl bromide in 1 L of MC was slowly added at a low temperature, and then agitation was performed at room temperature for 2 hours. After adding 374.08 g (9.35 mol) of sodium hydroxide (NaOH) to the solution, it was subjected to a reflux reaction for 20 hours using a reflux condenser. After completion of the reaction, water was added to the solution, which was extracted with MC, and then the solvent and remaining $^tBuNH_2$ were removed under reduced pressure to obtain 741 g (yield:

79.4%) of N-tert-butyl-2-(tert-butylamino)propanamide [N-(tert-butyl)-2-(tert-butylamino)-2-methylpropanamide] as a white solid.

After 655.07 g (17.3 mol) of lithium aluminum hydride (LiAlH$_4$) was suspended in 4 L of tetrahydrofurane (THF) at low temperature, a solution obtained by dissolving the synthesized solid in 1 L of THF was slowly added at low temperature. After this, the suspension was subjected to a reflux reaction for 1 day using a reflux condenser. After completion of the reaction, water was added at low temperature to the suspension, which was extracted with MC, and the solvent was removed under reduced pressure to obtain a transparent orange liquid. The transparent orange liquid was purified under reduced pressure to obtain 604.0 g (yield: 85%) of N$^1$,N$^2$-di-tert-butyl-2-methylpropane-1,2-diamine of Formula 3 below, which is a colorless liquid.

[Formula 3]

Boiling point: 40° C.@0.2 torr (bath reference)
$^1$H-NMR(C$_6$D$_6$): δ1.049 ([(CH$_3$)$_3$CNHC(CH$_3$)$_2$CH$_2$NHC(CH$_3$)$_3$], s, 9H)
δ1.179 ([(CH$_3$)$_3$CNHC(CH$_3$)$_2$CH$_2$NHC(CH$_3$)$_3$], s, 6H$_3$),
δ1.183 ([(CH$_3$)$_3$CNHC(CH$_3$)$_2$CH$_2$NHC(CH$_3$)$_3$], s, 9H),
δ2.341 ([(CH$_3$)$_3$CNHC(CH$_3$)$_2$CH$_2$NHC(CH$_3$)$_3$], s, 2H).

Example 1

Synthesis of N$^1$,N$^2$-Di-Tert-Butylpropane-1,2-Diamine-Zr-(NMe$_2$)$_2$ (ZEA)

To 3.74 g (0.016 mol) of zirconium chloride (ZrCl$_4$) in flask 1, 20 mL of hexane was added, and a solution obtained by dissolving 4.3 g (0.016 mol) of tetrakis(dimethylamino)zirconium (TDMA-Zr) in 10 mL of hexane was added at low temperature, and then agitation was performed at room temperature for 18 hours.

In flask 2, 6 g (0.032 mol) of N$^1$,N$^2$-di-tert-butylpropane-1,2-diamine manufactured in Synthesis Example 1 above was dissolved in 20 mL of hexane, and 25 mL (0.064 mol) of normal butyllithium ("BuLi) was slowly added at low temperature, and agitation was performed at room temperature for 18 hours.

The solution of said flask 2 was slowly added to said flask 1 at low temperature, and then agitation was performed at room temperature for 18 hours. The reactant was filtered and the solvent was removed under reduced pressure to obtain a transparent orange liquid. The resulting liquid was purified under reduced pressure to obtain 9 g (yield: 77%) of (N$^1$,N$^2$-di-tert-butylpropane-1,2-diamino)-bis(dimethylamino)Zr of Formula 1-1 below which is a light yellow liquid.

[Formula 1-1]

Molecular Weight: 363.70
Boiling point (b.p.): 100° C.@0.2 torr (bath reference)
$^1$H-NMR(C$_6$D$_6$): δ1.159 ([(CH$_3$)$_3$CNCH(CH$_3$)CH$_2$NC(CH$_3$)]-Zr-[N(CH$_3$)$_2$]$_2$, d, 18H),
δ1.564 ([(CH$_3$)$_3$CNCH(CH$_3$)CH$_2$NC(CH$_3$)$_3$]-Zr-[N(CH$_3$)$_2$]$_2$, d, 3H),
δ2.858 ([(CH$_3$)$_3$CNCH(CH$_3$)CH$_2$NC(CH$_3$)$_3$]-Zr-[N(CH$_3$)$_2$]$_2$, d, H),
δ3.066 ([(CH$_3$)$_3$CNCH(CH$_3$)CH$_2$NC(CH$_3$)$_3$]-Zr-[N(CH$_3$)$_2$]$_2$, d, 12H),
δ3.309 ([(CH$_3$)$_3$CNCH(CH$_3$)CH$_2$NC(CH$_3$)$_3$]-Zr-[N(CH$_3$)$_2$]$_2$, m, 1H),
δ3.988 ([(CH$_3$)$_3$CNCH(CH$_3$)CH$_2$NC(CH$_3$)$_3$]-Zr-[N(CH$_3$)$_2$]$_2$, dd, 1H).

Example 2

Synthesis of N$^1$,N$^2$-di-tert-butylpropane-1,2-diamine-Hf-(NMe$_2$)$_2$ (HEA)

To 44.9 g (0.14 mol) of hafnium chloride (HfCl$_4$) in flask 1, 300 mL, of hexane was added, and a solution obtained by dissolving 50 g (0.14 mol) of tetrakis(dimethylamino)hafnium (TDMAHf) in 100 mL of hexane was added at low temperature, and then agitation was performed at room temperature for 18 hours.

In flask 2, 52 g (0.28 mol) of N$^1$,N$^2$-di-ten-butylpropane-1,2-diamine manufactured in Synthesis Example 1 above was dissolved in 50 mL of hexane, and 225 mL (0.56 mol) of normal butyllithium ("BuLi) was slowly added at low temperature, and agitation was performed at room temperature for 18 hours.

The solution of said flask 2 was slowly added to said flask 1 at low temperature, and then agitation was performed at room temperature for 18 hours. The reactant was filtered and the solvent was removed under reduced pressure to obtain a transparent orange liquid. The resulting liquid was purified under reduced pressure to obtain 78 g (yield: 61%) of (N$^1$,N$^2$-di-tert-bulylpropane-1,2-diamino)-bis(dimethylamino)Hf of Formula 1-2 below, which is a light yellow liquid.

[Formula 1-2]

Molecular Weight: 450.96
Boiling point: 98° C.@0.2 torr (bath reference)
$^1$H-NMR(C$_6$D$_6$): δ1.141 ([(CH$_3$)$_3$CNCH(CH$_3$)CH$_2$NC(CH$_3$)$_3$]-Hf-[N(CH$_3$)$_2$]$_2$, d, 18H),
δ1.537 ([(CH$_3$)$_3$CNCH(CH$_3$)CH$_2$NC(CH$_3$)$_3$]-Hf-[N(CH$_3$)$_2$]$_2$, d, 3H),
δ2.914 ([(CH$_3$)$_3$CNCH(CH$_3$)CH$_2$NC(CH$_3$)$_3$]-Hf-[N(CH$_3$)$_2$]$_2$, d, 1H),
δ3.079 ([(CH$_3$)$_3$CNCH(CH$_3$)CH$_2$NC(CH$_3$)$_3$]-Hf-[N(CH$_3$)$_2$]$_2$, d, 12H),
δ3.423 ([(CH$_3$)$_3$CNCH(CH$_3$)CH$_2$NC(CH$_3$)$_3$]-Hf[N(CH$_3$)$_2$]$_2$, m, 1H),

δ3.941 ([(CH₃)₃CNCH(CH₃)C$\underline{H}$₂NC(CH₃)₃]-Hf-[N(CH₃)₂]₂, dd, 1H).

Example 3

Synthesis of $N^1,N^2$-Di-Tert-Butylpropane-1,2-Diamine-Hf-Me₂ (HEAM)

To flask 1, 20 g (0.063 mol) of $N^1,N^2$-di-tert-butylpropane-1,2-diamine-Hf-(NMe₂)₂ manufactured in Example 2 above and 100 mL of toluene were put, and 14.95 g (0.138 mol) of trimethylsilylchloride (TMS-Cl) was added at low temperature, and then agitation was performed at room temperature for 18 hours. The reactant was filtered to obtain HEA-Cl₂ as an intermediate product.

To flask 2, 14.3 g (0.033 mol) of reactant HEA-Cl₂ and 100 mL of toluene were put, and 36 mL of methyllithium solution was added at low temperature, and then agitation was performed at room temperature for 18 hours. The reactant was filtered and the solvent was removed under reduced pressure to obtain a transparent orange liquid. The resulting liquid was purified under reduced pressure to obtain 11 g (yield: 58%) of ($N^1,N^2$-di-tert-butylpropane-1,2-diamine)-bis(methyl)hafnium [$N^1,N^2$-di-tert-butylpropane-1,2-diamine-Hf-Me₂] of Formula 1-8 below, which is a light yellow liquid.

[Formula 1-8]

Molecular Weight: 392,88
Boiling point: 80° C.@0.4 torr (bath reference)
¹H-NMR(C₆D₆): δ0.130 ([(CH₃)₃CNCH(CH₃)CH₂NC(CH₃)₃]-Hf-(C$\underline{H}$₃)₂, s, 6H),
δ1.185 ([(C$\underline{H}$₃)₃CNCH(CH₃)CH₂NC(CH₃)₃]-Hf-(CH₃)₂, d, 18H),
δ1.390 ([(CH₃)₃CNCH(CH₃)C$\underline{H}$₂NC(CH₃)₃]-Hf-(CH₃)₂, d, 3H),
δ2.805 ([(CH₃)₃CNC$\underline{H}$(CH₃)CH₂NC(CH₃)₃]-Hf-(CH₃)₂, d, 12H),
δ3.480 ([(CH₃)₃CNC$\underline{H}$(CH₃)CH₂NC(CH₃)₃]-Hf-(CH₃)₂, in, 1H),
δ3.905 ([(CH₃)₃CNCH(CH₃)C$\underline{H}$₂NC(CH₃)₃]-Hf-(CH₃)₂, dd, 1H).

Example 4

Synthesis of $N^1,N^2$-Di-Tert-Butylpropane-1,2-Diamine-Ti-Me₂ (TEAM)

200 mL of toluene was agitated at low temperature with 25.0 g (0.13 mol) of titanium chloride (TiCl₄) in flask 1.

In flask 2, 24.6 g (0.13 mol) of $N^1,N^2$-di-tert-butylpropane-1,2-diamine manufactured in Synthesis Example 1 above was dissolved in 50 mL of toluene, and 40.4 mL (0.29 mol) of triethylamine was slowly added at low temperature, and agitation was performed at room temperature for 18 hours. The reactant was filtered to obtain TEA-Cl₂ as an intermediate product.

To flask 3, 10.0 g (0.033 mol) of reactant TEA-Cl₂ and 100 mL of toluene were put, and 45.4 mL of methyllithium solution was added at low temperature, and then agitation was performed at room temperature for 18 hours. The reactant was filtered and the solvent was removed under reduced pressure to obtain a transparent orange liquid. The resulting liquid was purified under reduced pressure to obtain 7.1 g (yield: 60%) of ($N^1,N^2$-di-tert-butylpropane-1,2-diamino)-bis(methyl)Ti of Formula 1-9 below, which is a transparent liquid.

[Formula 1-9]

Molecular Weight: 262.26
Boiling point: 90° C.@0.4 torr (bath reference)
¹H-NMR(C₆D₆): δ0.580 ([(CH₃)₃CNCH(CH₃)CH₂NC(CH₃)₃]-Ti-(C$\underline{H}$₃b)₂s, 3H),
δ0.620 ([(C$\underline{H}$₃)₃CNCH(CH₃)CH₂NC(CH₃)₃]-Ti-(C$\underline{H}$₃)₂, s, 3H),
δ1.310 ([(CH₃)₃CNCH(C$\underline{H}$₃)CH₂NC(CH₃)₃]-Ti-(CH₃)₂, d, 3H),
δ1.355 ([(C$\underline{H}$₃)₃CNCH(CH₃)CH₂NC(C$\underline{H}$₃)₃]-Ti-(CH₃)₂, d, 18H),
δ2.675 ([(CH₃)₃CNCH(CH₃)C$\underline{H}$₂NC(CH₃)₃]-Ti-(CH₃)₂, d, 1H),
δ3.350 ([(CH₃)₃CNC$\underline{H}$(CH₃)CH₂NC(CH₃)₃]-Ti-(CH₃)₂, m, 1H),
δ3.930 ([(CH₃)₃CNCH(CH₃)C$\underline{H}$₂NC(CH₃)₃]-Ti-(CH₃)₂, dd, 1H).

Example 5

Synthesis of $N^1,N^2$-Di-Tert-Butyl-2-Methylpropane-1,2-Diamine-Hf-(NMe₂)₂ (HGEA)

To 44.9 g (0.14 mol) of hafnium chloride (HfCl₄) in flask 1, 300 mL of hexane was added, and a solution obtained by dissolving 50 g (0.14 mol) of tetrakis(dimethylamino)hafnium (TDMA-Hf) in 100 mL of hexane was added at low temperature, and then agitation was performed at room temperature for 18 hours.

In flask 2, 56.1 g (0.28 mol) of $N^1,N^2$-di-tert-methylbutyl-propane-1,2-diamine ($N^1,N^2$-di-tert-butyl-2-methylpropane-1,2-diamine) manufactured in Synthesis Example 2 above was dissolved in 50 mL of hexane, and 225 mL (0.56 mol) of normal butyllithium ("BuLi) was slowly added at low temperature, and agitation was performed at room temperature for 18 hours.

The solution of said flask 2 was slowly added to said flask 1 at low temperature, and then agitation was performed at room temperature for 18 hours. The reactant was filtered and the solvent was removed under reduced pressure to obtain a transparent orange liquid. The resulting liquid was purified under reduced pressure to obtain 78 g (yield: 61%) of ($N^1,N^2$-di-tert-butyl-2-methylpropane-1,2-diamino)-bis(dimethylamino)Hf of Formula 1-5 below, which is a light yellow liquid.

[Formula 1-5]

Molecular Weight: 464.99
Boiling point: 111° C.@0.4 torr (bath reference)
$^1$H-NMR($C_6D_6$): δ1.180 ([(C$\underline{H}$$_3$)$_3$CNC(CH$_3$)$_2$CH$_2$NC(CH$_3$)$_3$]-Hf-[N(CH$_3$)$_2$]$_2$, s, 9H),
δ1.280 ([(CH$_3$)$_3$CNC(CH$_3$)$_2$CH$_2$NC(C$\underline{H}$$_3$)$_3$]-Hf-[N(CH$_3$)$_2$]$_2$, s, 9H),
δ1.400 ([(CH$_3$)$_3$CNC(C$\underline{H}$$_3$)$_2$CH$_2$NC(CH$_3$)$_3$]-Hf-[N(CH$_3$)$_2$]$_2$, s, 6H),
δ3.070 ([(CH$_3$)$_3$CNC(CH$_3$)$_2$CH$_2$NC(C$_3$)$_3$]-Hf-[N(C$\underline{H}$$_3$)$_2$]$_2$, s, 12H),
δ3.110 ([(CH$_3$)$_3$CNC(CH$_3$)$_2$C$\underline{H}$$_2$NC(CH$_3$)$_3$]-Hf-[N(CH$_3$)$_2$]$_2$, s, 2H).

Experimental Example 1

Analysis of Characteristics of Vapor Deposited Zirconium Precursor

Figure 1:
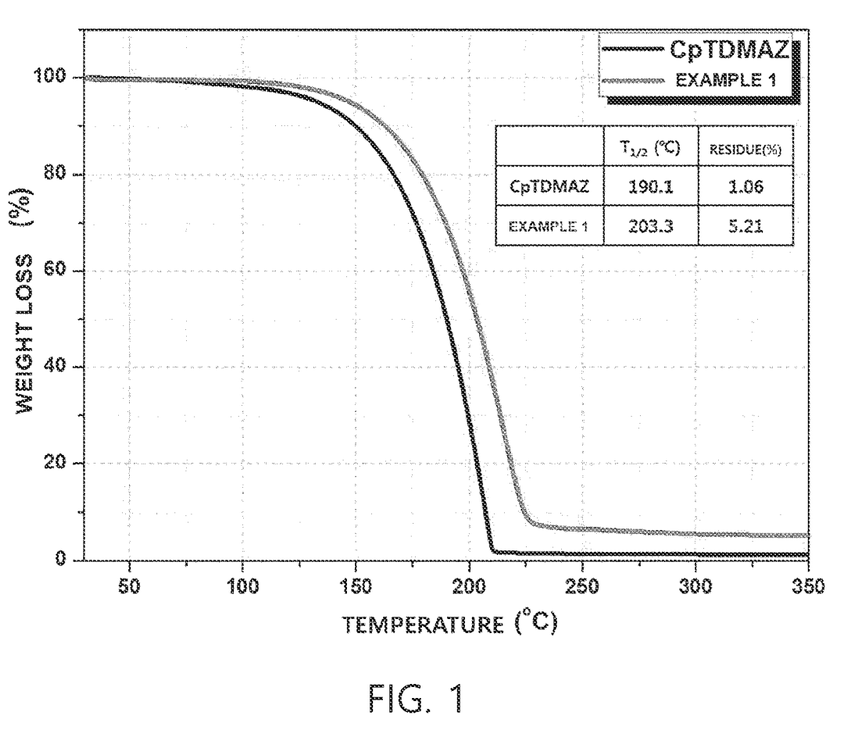
FIG. 1 is a thermogravimetric analysis (TGA) graph comparing thermal decomposition characteristics of a zirconium precursor (ZEA) according to Example 1 of the present application and a zirconium precursor (ZAC) according to Comparative Example 1.
Figure 2:
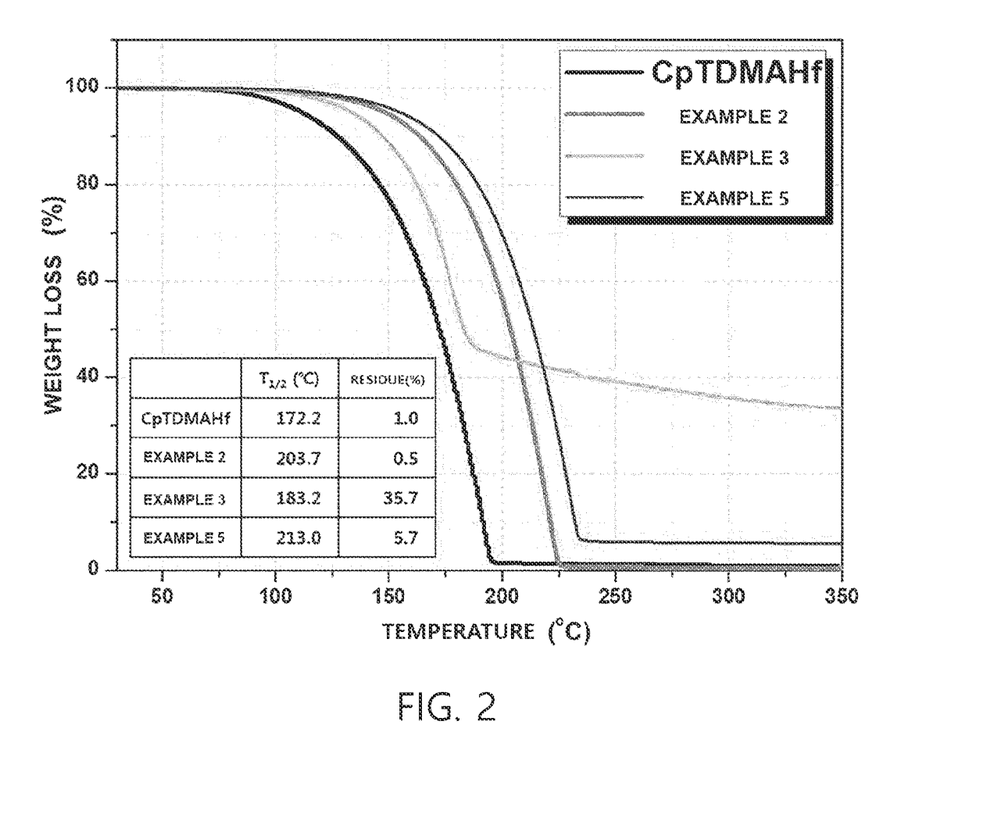
FIG. 2 is a thermogravimetric analysis (TGA) graph comparing the thermal decomposition characteristics of the hafnium precursors (HEA, HEAM, and HGEA) according to Examples 2, 3, and 5 of the present application and the hafnium precursor (HAC) according to Comparative Example 2.
Figure 3:
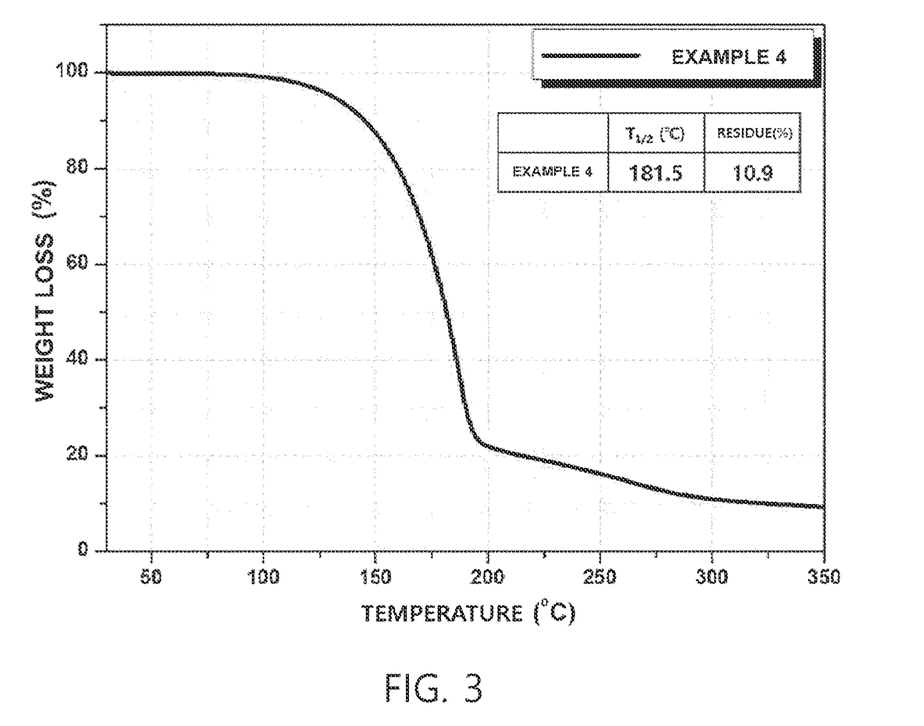
FIG. 3 is a thermogravimetric analysis (TGA) graph of a titanium precursor (TEAM) according to Example 4 of the present application.

In this Experimental Example, as shown in FIGS. 1 to 3, for analysis of characteristics of vapor deposition precursors of Examples 1 to 5, which had been manufactured previously, thermogravimetric analysis (TGA), the temperature at which the weight is reduced by half [$T_1/2$], the residues after thermal analysis were measured, respectively. The results are summarized in Table 1 below Specifically, in conducting the analysis of characteristics of the vapor deposition precursor manufactured in Example 1 (ZEA) above, Comparative Example 1 [CpTDMAZ (Cyclopentadienyl Tris (dimethylamino) Zirconium; ZAC)] was set as a control, and in conducting the analysis of characteristics of the vapor deposition precursors manufactured in Example 2 (HEA); Example 3 (HEAM) and Example 5 (HGEA), Comparative Example 2 [CpTDMAH(Cyclopentadienyl Tris(dimethylamino)Hafnium; HAC)] was set as a control.

TABLE 1

| | $T_{1/2}$ (° C.) | Residues (%) |
|---|---|---|
| Example 1 (ZEA) | 203.3 | 5.21 |
| Example 2 (HEA) | 203.7 | 0.5 |
| Example 3 (HEAM) | 183.2 | 35.7 |
| Example 4 (TEAM) | 181.5 | 10.9 |
| Example 5 (HGEA) | 213.0 | 5.7 |

An amino chelate compound is a compound frequently used as a precursor, and exhibits excellent reactivity and volatility. Therefore, in this Example, a precursor was synthesized in a chelating structure to a central metal (zirconium or hafnium) by utilizing an alkyl chain with dimethyl (Dimethyl). It can be expected that volatility is also excellent because it is characterized by being purified at a temperature similar to CpTDMAZ and CpTDMAH among existing precursors, which were used as comparative examples. In this Example, a precursor was secured using a diamine-based organic ligand, and changes in physical properties were compared and analyzed while modifying the central metal. Therefore, $N^1,N^2$-di-tert-butylpropane-1,2-diamine Zr(NMe$_2$)$_2$ and $N^1,N^2$-di-tert-butylpropane-1,2-diamine Hf(NMe$_2$)$_2$ were synthesized, and their physical properties were checked. Novel zirconium compound and hafnium compound synthesized in this Example were liquid compounds, and could be purified at a relatively low temperature.

Manufacture Example 1

Manufacture 1 of Zirconium Oxide Film Using an Atomic Layer Deposition (ALD) Method A zirconium oxide film was manufactured through the atomic layer deposition (ALD) method using the zirconium compound synthesized in Example 2 as a precursor. The temperature of the precursor used in this Manufacture Example was maintained at 90° C. AP-type silicon wafer doped with boron was used as the substrate. Ozone was used as an oxidizing agent, and the concentration of ozone was 144 g/m$^3$, and it was generated from 125 sccm of oxygen gas. Argon, which is an inert gas, was used for the purpose of purge and precursor carrier. The flow rate of purge argon is 500 sccm, and the flow rate of carrier argon is 10 sccm.

(Injection of precursor for X second(s))-(Injection of precursor purge argon for 10 seconds)-(Injection of oxidizing agent for 3 seconds)-(Injection of oxidizing agent purge argon for 10 seconds) were sequentially performed, and these constituted one cycle. In supplying the precursor, the X second(s) was set to 1 second to 7 seconds, the process temperature was set to 260° C., and a zirconium oxide film was deposited via 200 cycles.

Figure 4:
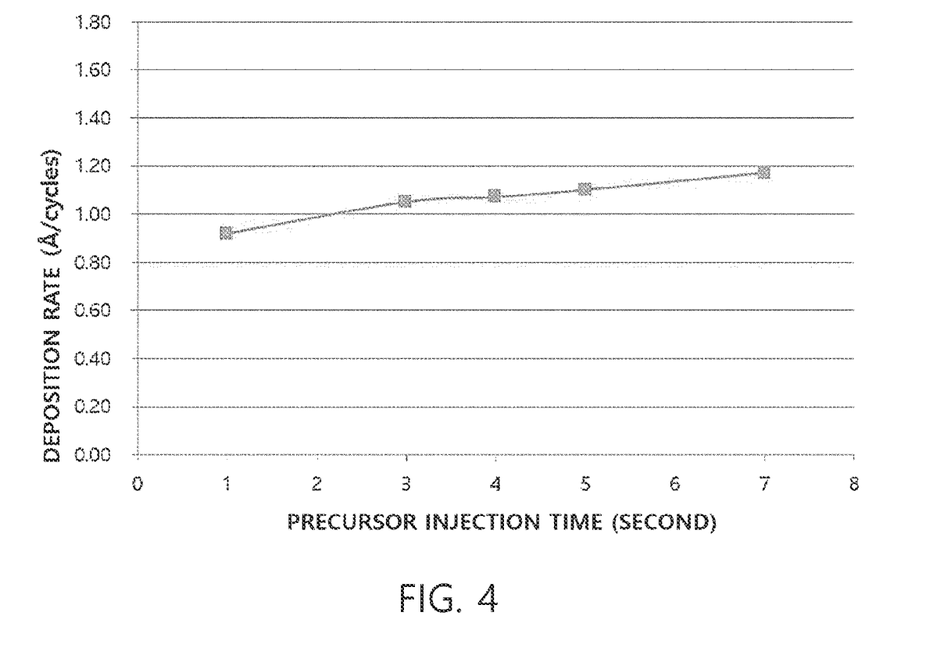
FIG. 4 is a graph showing a zirconium oxide film deposition rate depending on a precursor injection time in Manufacture Example 1 of the present application.

As shown in FIG. 4, the deposition rate increased from 0.92 Å/cycle to 1.17 Å/cycle as the precursor injection time increased from 1 second to 7 seconds.

Manufacture Example 2

Manufacture 2 of Zirconium Oxide Film Using an Atomic Layer Deposition (ALD) Method A zirconium oxide film was deposited under conditions in which precursor purge argon injection time, oxidizing agent purge argon injection time, process temperature, and the number of cycles were maintained the same as in Manufacture Example 1, and precursor injection time was fixed at 5 seconds, and oxidizing agent injection time was set to 1 to 5 seconds.

Figure 5:
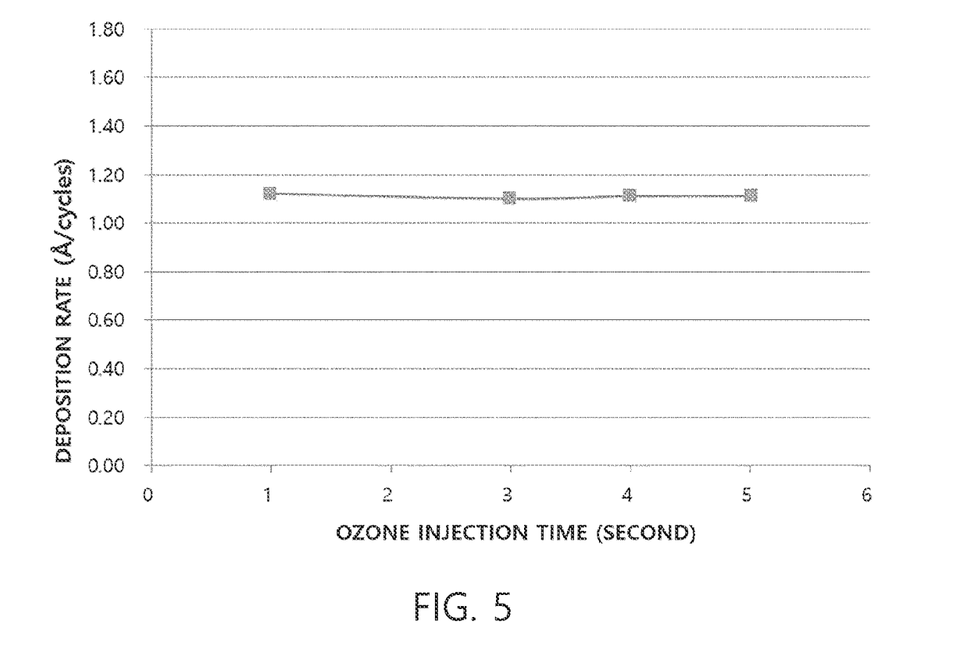
FIG. 5 is a graph showing a zirconium oxide film deposition rate depending on an oxidizing agent injection time in Manufacture Example 2 of the present application.

As can be seen in FIG. 5, the deposition rate was constant at 1.11 Å/cycle even though the oxidizing agent injection time increased from 1 second to 5 seconds. This means that a self-limited reaction of the oxidizing agent occurs at an injection time of 1 second.

Manufacture Example 3

Manufacture 3 of Zirconium Oxide Film Using an Atomic Layer Deposition (ALD) Method A zirconium oxide film was deposited under conditions in which precursor purge argon injection time, oxidizing agent purge argon injection time, and the number of cycles were maintained the same as in Manufacture Examples 1 and 2, and precursor injection time and oxidizing agent injection time were fixed at 5 seconds and 3 seconds, respectively, and process temperature was set at 220° C. to 320° C.

Figure 6:
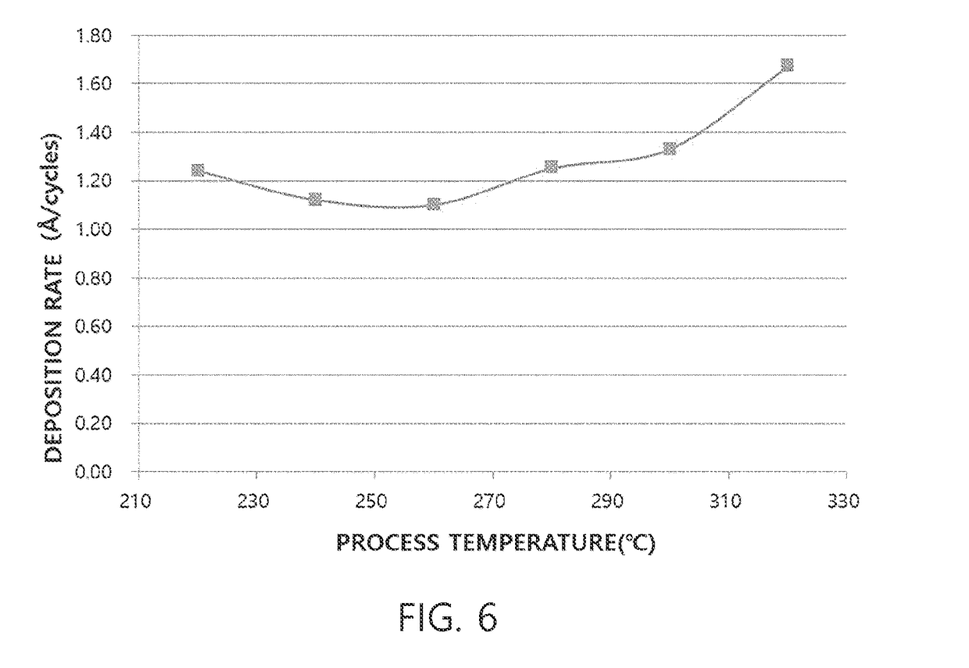
FIG. 6 is a graph showing a zirconium oxide film deposition rate depending on a process temperature in Manufacture Example 3 of the present application.

As shown in FIG. 6, the deposition rate maintains 1.10 Å/cycle to 1.25 Å/cycle at the process temperature of 220° C. to 280° C., while the deposition rate is 1.33 Å/cycle at 300° C. And when the process temperature was increased to 320° C., the deposition rate further increased to 1.67 Å/cycle.

In the atomic layer deposition (ALD) method, the section where the deposition rate is constant regardless of the process temperature is referred to as an ALD window. The aforementioned results mean that the precursor synthesized in Example I exhibits an ALD window of 220° C. to 280° C. Meanwhile, at 300° C. or higher, the process temperature and the deposition rate increase proportionally, which is a region similar to CVD.

Manufacture Example 4

Manufacture 1 of Hafnium Oxide Film Using an Atomic Layer Deposition (ALD) Method A hafnium oxide film was manufactured through the atomic layer deposition (ALD) method using the hafnium compound synthesized in Example 2 as a precursor. The temperature of the precursor used in this Manufacture Example was maintained at 80° C. The type of substrate, the type of oxidizing agent, the concentration of ozone, and the flow rates of purge and carrier argon were the same as in Manufacture Example 1.

(Injection of precursor for X second(s))-(Injection of precursor purge argon for 40 seconds)-(Injection of oxidizing agent for 5 seconds)-(Injection of oxidizing agent purge argon for 10 seconds) were sequentially performed, and these constituted one cycle. In supplying the precursor, the X second(s) was set to 5 seconds to 15 seconds, the process temperature was set to 240° C. to 260° C., and a hafnium oxide film was deposited via 200 cycles.

Figure 7:
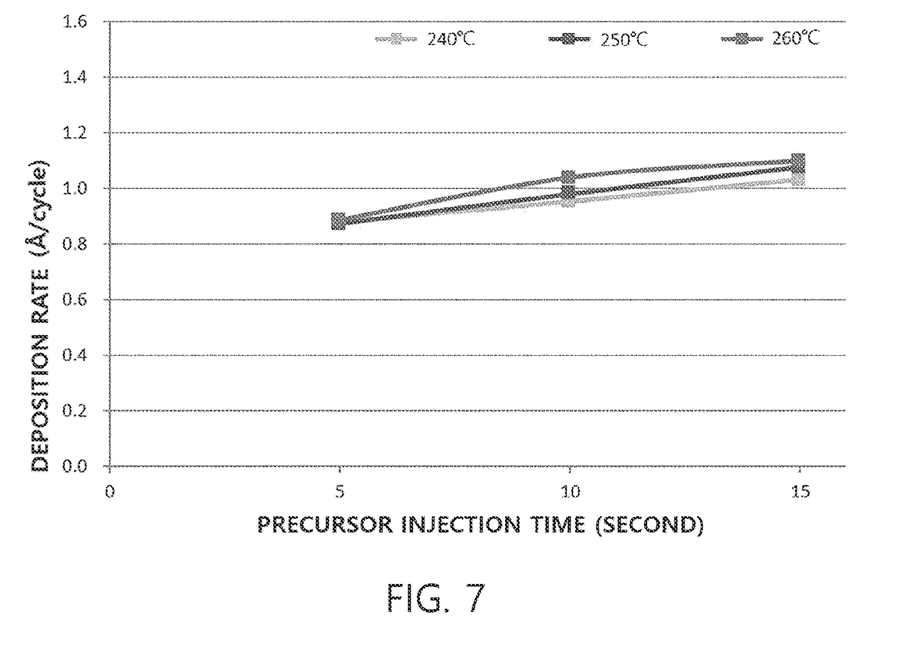
FIG. 7 is a graph showing a hafnium oxide film deposition rate depending on a precursor injection time and a process temperature in Manufacture Example 4 of the present application.

As shown in FIG. 7, the deposition rate increased from 0.88 Å/cycle to 1.03 Å/cycle as the precursor injection time increased from 5 seconds to 15 seconds at a process temperature of 240° C. At process temperatures of 250° C. and 260° C., the corresponding deposition rates increased from 0.87 Å/cycle to 1.08 Å/cycle, and from 0.89 Å/cycle to 1.10 Å/cycle, respectively.

Manufacture Example 5

Manufacture 2 of Hafnium Oxide Film Using an Atomic Layer Deposition (ALD) Method A hafnium oxide film was deposited under conditions in which precursor purge argon injection time, oxidizing agent purge argon injection time, and the number of cycles were maintained the same as in Manufacture Example 4, and precursor injection time was fixed at 15 seconds, and process temperature was fixed to 250° C., and oxidizing agent injection time was set to 1 to 5 seconds.

Figure 8:
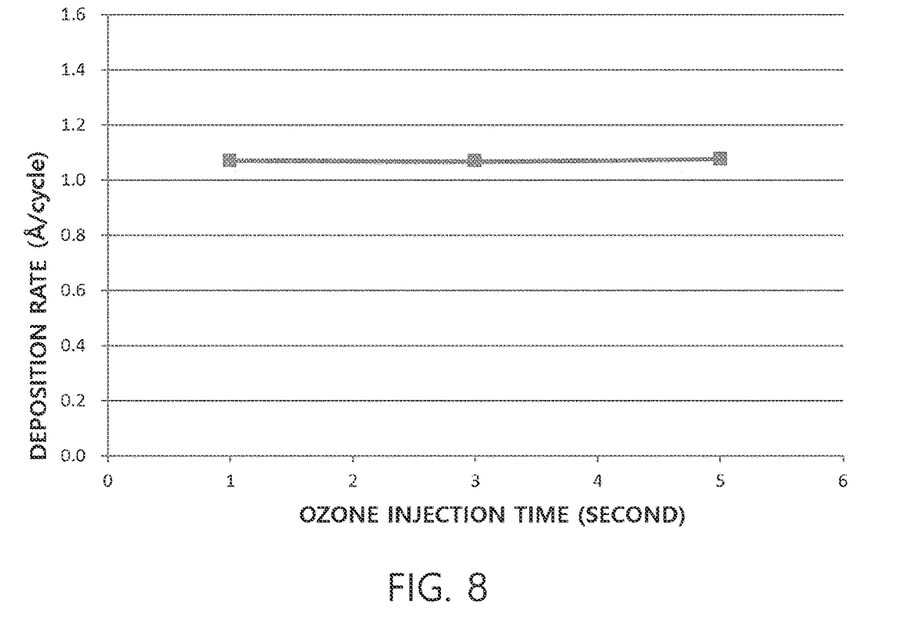
FIG. 8 is a graph showing a hafnium oxide film deposition rate depending on an oxidizing agent injection time in Manufacture Example 5 of the present application.

As can be seen in FIG. 8, the deposition rate was constant at 1.07 Å/cycle even though the oxidizing agent injection time increased from 1 second to 5 seconds. This means, as mentioned in Manufacture Example 2 above, that a self-limited reaction of the oxidizing agent occurs at an injection time of 1 second.

INDUSTRIAL APPLICABILITY

The novel Group 4 metal element-containing compound according to the present disclosure and the vapor deposition precursor composition including the compound can have excellent thermal stability, realize thin film deposition in a wide temperature range, and reduce residues caused by heat loss, thereby preventing side reactions in a process. Additionally, the vapor deposition precursor composition according to the present disclosure can realize uniform thin film deposition, thereby securing excellent physical properties of the thin film.

The above-described physical properties can provide a precursor suitable for an atomic layer deposition method, and can be expected to be applied to a gate dielectric material through a thin film manufactured by depositing the precursor.

The invention claimed is:

1. A compound represented by Formula 1 below:

[Formula 1]

wherein:

M denotes zirconium (Zr), hafnium (Hf), or titanium (Ti);

$R_1$ to $R_4$ denote each independently hydrogen, a substituted or unsubstituted, linear or branched, saturated or unsaturated hydrocarbon group having 1 to 6 carbon atoms; and

$R_5$ and $R_6$ denote each independently a linear or branched alkyl group having 1 to 4 carbon atoms, a dialkylamine group having 1 to 4 carbon atoms, or an alkoxy group having 1 to 4 carbon atoms, wherein at least one of $R_3$ and $R_4$ is a substituted or unsubstituted linear or branched, saturated or unsaturated hydrocarbon group having 1 to 6 carbon atoms.

2. The compound of claim 1, wherein the compound represented by Formula 1 is represented as any one of Formulas 1-1 to 1-9 below:

[Formula 1-1]

[Formula 1-2]

[Formula 1-3]

[Formula 1-4]

[Formula 1-5]

[Formula 1-6]

[Formula 1-7]

[Formula 1-8]

[Formula 1-9]

wherein in Formulas 1-1 to 1-6 above, Me denotes a methyl group.

* * * * *